United States Patent

Harris et al.

[11] Patent Number: 5,535,905
[45] Date of Patent: Jul. 16, 1996

[54] ETCHING TECHNIQUE FOR PRODUCING CUBIC BORON NITRIDE FILMS

[75] Inventors: Stephen J. Harris, Bloomfield Hills; Anita M. Weiner, West Bloomfield; Gary L. Doll, Southfield; Brian K. Fuller, Shelby Township, Macomb County, all of Mich.

[73] Assignee: General Motors Corporation, Detroit, Mich.

[21] Appl. No.: 283,315

[22] Filed: Jul. 29, 1994

[51] Int. Cl.$^6$ ....................................................... B05D 5/00
[52] U.S. Cl. ........................... 216/37; 216/64; 216/67; 216/74; 204/192.1
[58] Field of Search .................................... 427/569, 586, 427/596; 204/192.1, 192.3, 192.15, 192.35; 216/64, 67, 74, 37

[56] References Cited

U.S. PATENT DOCUMENTS

| | | | |
|---|---|---|---|
| 5,096,740 | 3/1992 | Nakagama et al. | 427/587 X |
| 5,217,567 | 6/1993 | Cote et al. | 156/643 |
| 5,324,690 | 6/1994 | Gelatos et al. | 437/236 |
| 5,366,556 | 11/1994 | Prince et al. | 118/715 X |

OTHER PUBLICATIONS

J. Szmidt, "Selective Etching of c–BN Layers", Warsaw Univ Technol, Inst Microelectr & Optoelectr, Koszykowa 75/PL–00662 Warsaw/Poland; Diamond and Related Materials, vol. 3, No. 4–6, pp. 650–653, Apr. 1994—Abstract Attached.

Primary Examiner—Thi Dang
Attorney, Agent, or Firm—Cary W. Brooks

[57] ABSTRACT

The invention generally includes a new technique for making cubic boron nitride films with low contamination from other forms of boron nitride such as hexagonal and amorphous boron nitride. Films including either hexagonal or amorphous boron nitride are etched in a gas atmosphere including a halogen and/or hydrocarbon radical, preferably a methyl radical ($CH_3\bullet$). Such atmospheres may be a plasma etching atmosphere also including hydrogen and hydrogen atoms. The etching technique is successful in removing hexagonal or amorphous boron nitride and leaving cubic boron nitride, or in converting hexagonal or amorphous boron nitride into cubic boron nitride, thus increasing the concentration of cubic boron nitride in the film. Interestingly, little or no etching of hexagonal or amorphous boron nitride occurs using only hydrogen or hydrogen atoms.

5 Claims, 2 Drawing Sheets

ETCHING TECHNIQUE FOR PRODUCING CUBIC BORON NITRIDE FILMS

FIELD OF THE INVENTION

This invention relates to a new technique for making cubic boron nitride (cBN) films with lower contamination from other forms of boron nitride, such as hexagonal and amorphous boron nitride. More particular, this invention relates to etching a boron nitride film including hexagonal boron nitride and/or amorphous boron nitride in a gas atmosphere including hydrocarbons such as methyl radicals, and/or halogen radicals to remove hexagonal and amorphous boron nitride.

BACKGROUND OF THE INVENTION

Boron nitride (BN) compounds are in some ways analogous to the carbon system. Boron nitride forms hexagonal and cubic allotropes which are isoelectronic with those of carbon, and a number of properties of BN are similar to those of graphite or diamond. Boron nitride is a useful material in all its forms. Hexagonal boron nitride and amorphous boron nitride are thermal and electrical insulators, and are largely transparent at infrared and microwave wavelengths, as well as being very chemically resistant. Some forms of amorphous boron nitride are also very hard and could serve as wear-resistant and corrosion-resistant coatings.

The properties of cubic boron nitride (cBN) are exceptional. After diamond, cBN is the hardest material known, and since it is more chemically inert than diamond, it is the premier cutting material for ferrous materials. Cubic boron nitride, after diamond, has the highest thermal conductivity of any material. Further, cubic boron nitride has a large band gap and can be doped both p-type and n-type (unlike diamond), and thus cubic boron nitride has great promise as a semiconductor material.

Most low pressure techniques for producing cubic boron nitride also form hexagonal boron nitride and amorphous boron nitride and it is desirable to remove the hexagonal and amorphous forms. However, boron nitride is not easily etched by most acids or bases, although strong mixtures of nitric and phosphoric acids can etch boron nitride slowly at high temperatures.

The present invention overcomes many of the disadvantages of the prior art.

SUMMARY OF THE INVENTION

The invention generally includes a new technique for making cubic boron nitride films with low contamination from other forms of boron nitride such as hexagonal and amorphous boron nitride. Films including either hexagonal or amorphous boron nitride are etched in a gas atmosphere including a halogen and/or hydrocarbon radical, preferably a methyl radical ($CH_3\bullet$). Such atmospheres may be a plasma etching atmosphere including hydrocarbons, such as methane or acetylene and other hydrocarbon radicals such as the methyl radical and/or halogen radicals. Additional gases such as hydrogen or hydrogen atom producing gases may be present in the plasma. The etching technique is successful in removing hexagonal or amorphous boron nitride and leaving cubic boron nitride, or in converting hexagonal or amorphous boron nitride into cubic boron nitride, thus increasing the concentration of cubic boron nitride in the film. Interestingly, little etching of hexagonal or amorphous boron nitride occurs using only hydrogen molecules or hydrogen atoms.

The invention also includes a method of making cubic boron nitride by depositing boron nitride by, for example, ion plating, sputtering or pulsed laser deposition in the presence of a halogen or hydrocarbon plasma and so that the halogen or hydrocarbon plasma etches away the non-cubic boron nitride.

These and other objects and advantages of the present invention will be apparent from the following brief description of the drawings, detailed description and appended claims and drawings.

DETAILED DESCRIPTION

Figure 1:
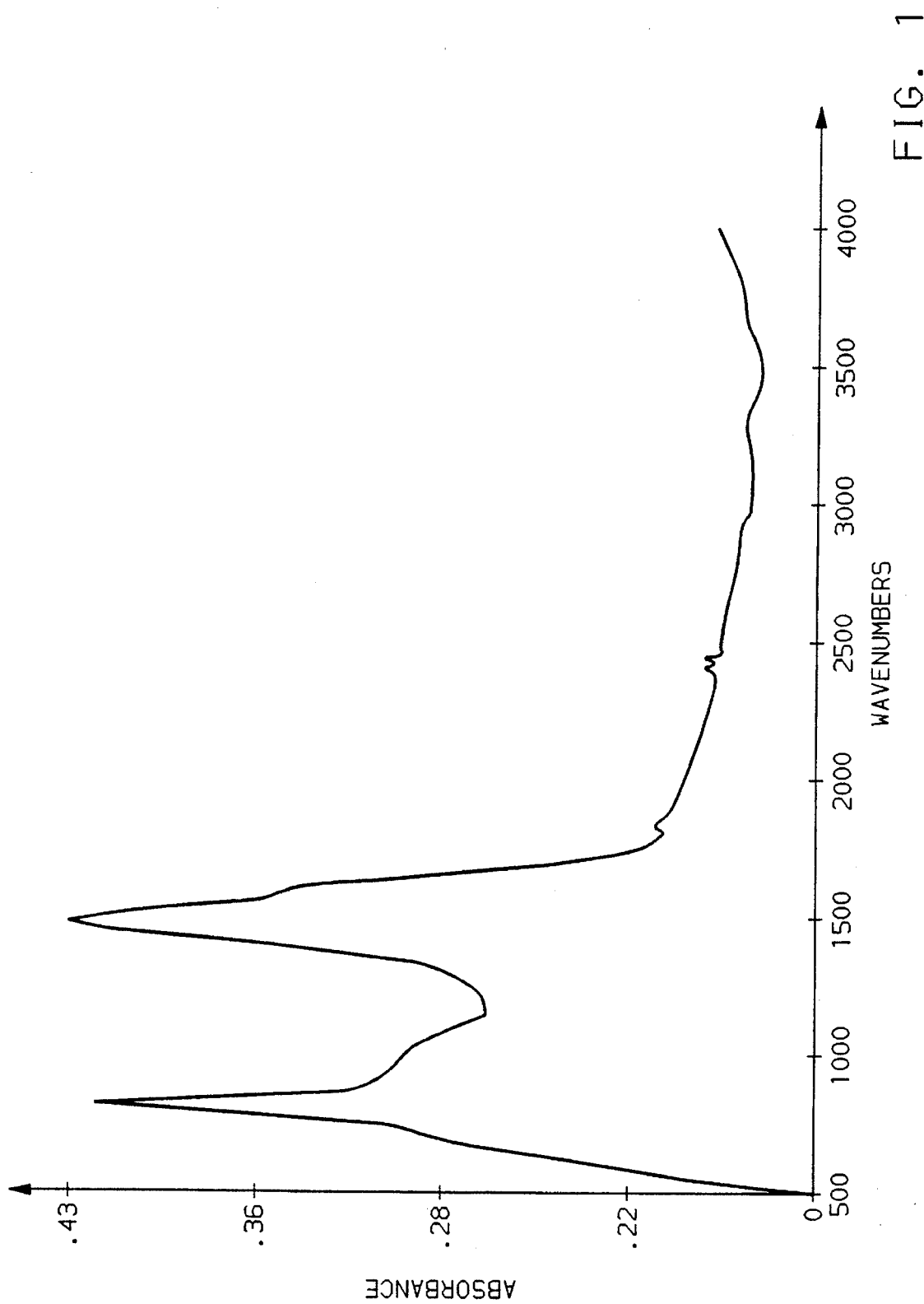
FIG. 1 is a plot of the data from an infrared spectrum of a film showing large peaks at 1400 and 800 wavenumbers which indicate the presence of hexagonal/amorphous boron nitride.

A thin blue film of boron nitride was deposited on a silicon wafer using a laser ablation technique such as that described in U.S. Pat. No. 5,264,296 to Gary L. Doll et al, entitled "Laser Deposition of Crystallive Boron Nitride Films", issued May 16, 1990 and assigned to the assignee of the present invention, the disclosure of which is hereby incorporated by reference. In general the technique includes the use of KrF excimer pulsed lasers and ArF pulsed lasers which are directed to a target of boron nitride, such as hexagonal boron nitride, so that ions are admitted from the target and so that the ions can re-associate on a substrate to form primarily cubic boron nitride. The process may be enhanced using ion-assisted pulsed laser deposition to produce the cubic boron nitride films. For example, a Kaufman-type ion source may be used to deliver nitrogen ions to a substrate during laser deposition. With an ion-assisted process, broad-beam ions sources may improve adhesion of the film to the substrate, increasing the density of nucleation sites, reducing the tensile stress of the films, assistant preferential crystal orientation, result in selection of stronger bonds, and provide stoichiometric nitride films. FIG. 1 is an infrared spectrum of a film produced using a technique similar to that described above and showing a large peak at 1400 wavenumbers which indicates the presence of hexagonal or amorphous boron nitride. The film used to generate the FIG. 1 data was deliberately grown so that little or no cubic boron nitride was present. No peak is observed at 1080 wavenumbers which indicates little or no cubic phase is present.

Figure 2:
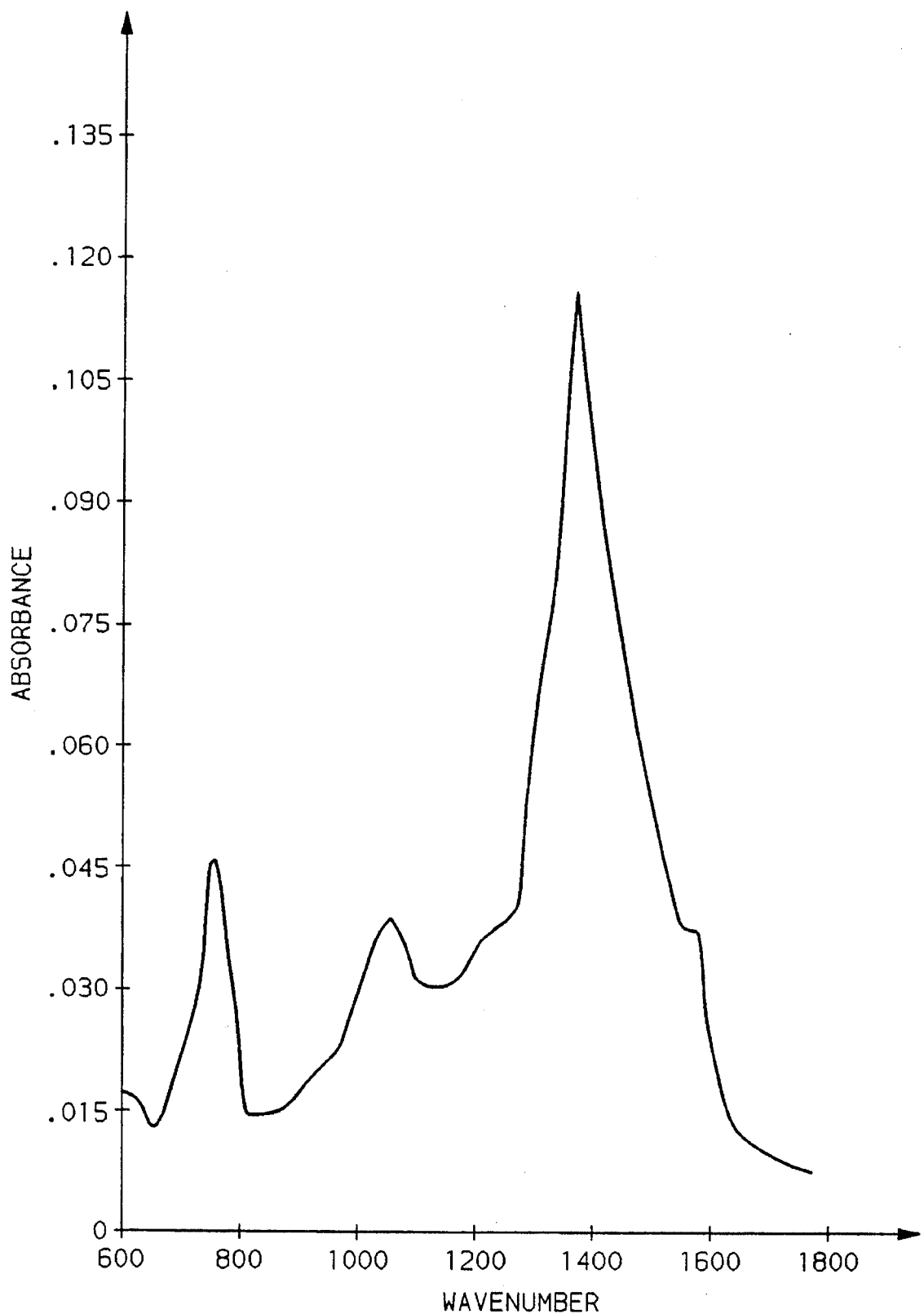
FIG. 2 is a plot of data from an infrared spectrum of the film of FIG. 1 after being etched according to the present invention and showing a small peak at 1080 wavenumbers indicating an increased presence of cubic boron nitride in the film.

The wafer from which the FIG. 1 data were generated, was then placed in a vacuum chamber fed with 1% methane in hydrogen to approximately 20 torr. A hot tungsten filament at 2150° C. was placed near the wafer to activate the gas. Other forms of activation of the gas, such as microwave plasma, have been shown to produce a nearly identical chemical composition in the gas above the wafer. After approximately two hours it was observed that some of the film had disappeared. The wafer was removed from the chamber and another infrared spectrum was taken. The results are shown in FIG. 2, wherein a small peak is observed at 1080 wavenumbers. The peak at 1080 wavenumbers indicates either that cubic boron nitride has been formed or that cubic boron nitride originally in the film comprises a much larger fraction of the film. In either case, visual inspection shows that amorphous boron nitride in the original film was etched. There have been no previous reports of gas phase etching of any form of boron nitride.

In order to better understand the chemistry of the etching process, another boron nitride coated wafer similar to that used to produce the data in FIG. 1 was placed in a chamber and the chamber was filled with pure hydrogen. The etching conditions were similar to that described above. However, hardly any etching of the boron nitride film was observed. This indicates that species produced from the methane were primarily responsible for the etching process. We speculate at this point that methyl radicals can attack the amorphous boron nitride to form trimethyl boron. The cubic boron nitride is unaffected by the methyl radicals, and the infrared measurements show a significant increase in the cubic content of the boron nitride films after exposure to the hydrogen/hydrocarbon mixture.

Thus, the present invention includes an etching technique using hydrocarbons such as, but not limited to, methane and acetylene and hydrocarbon radicals such as the methyl radical in a gas atmosphere, such as plasma. The amount of halogen or hydrocarbon present in the gas stream for the etching atmosphere may vary from about 0.1 to less than 10%, but is preferably about 1% by volume. Amounts less than 1% can be utilized but the etching process is slow. Increasing the amounts above 1% by volume at some point has a limiting effect because the methyl radicals produced in the plasma tend to recombine with each other thus limiting the etching process. High concentrations of halogens would become very corrosive. Of course the radical can be produced by a variety of hydrocarbon materials, halogens or halocarbons such as $C_2H_3F_3$, $C_2H_5Cl$, or methane and other etching gases known to those skilled in the semiconductor manufacturing arts. The invention also includes a method including depositing a boron nitride film on a substrate in the presence of a halogen and/or hydrocarbon plasma so that boron nitride not in the cubic phase is etched away leaving predominately cubic boron nitride. The boron nitride may be deposited by a variety of chemical vapor deposition and plasma vapor deposition methods, and the films produced may have a thickness of near 0 to 10 microns.

The embodiments of the invention in which an exclusive property or privilege is claimed is defined as follows:

1. A method of increasing the concentration of cubic boron nitride in a film comprising:

etching a film including cubic boron nitride and other forms of boron nitride in a gas environment including hydrocarbon radicals, and wherein said radicals are produced from a gas stream including methane.

2. A method as set forth in claim 1 wherein said methane is present in the gas stream in a concentration of about 1% by volume.

3. A method as set forth in claim 1 wherein said gas environment further comprises hydrogen.

4. A method of etching a boron nitride film comprising:

etching the film in a plasma comprising methyl radicals.

5. A method of making a cubic boron nitride film comprising:

energizing a boron nitride target with an pulsed excimer laser to produce boron and nitrogen ions and allowing the ions to re-associate on a substrate to form boron nitride, in the presence of a hydrocarbon plasma so that boron nitride other than the cubic phase is etched away leaving predominately cubic boron nitride.

\* \* \* \* \*